(12) United States Patent
Lee et al.

(10) Patent No.: US 9,659,717 B2
(45) Date of Patent: May 23, 2017

(54) MEMS DEVICE WITH CONSTANT CAPACITANCE

(71) Applicant: Analog Devices Global, Hamilton (BM)

(72) Inventors: Check F. Lee, Bedford, MA (US);
Raymond C. Goggin, Watergrasshill (IE); Padraig L. Fitzgerald, Mallow (IE)

(73) Assignee: Analog Devices Global, Hamilton (BM)

( * ) Notice: Subject to any disclaimer, the term of this patent is extended or adjusted under 35 U.S.C. 154(b) by 94 days.

(21) Appl. No.: 14/182,839

(22) Filed: Feb. 18, 2014

(65) Prior Publication Data
US 2015/0235779 A1    Aug. 20, 2015

(51) Int. Cl.
*H01L 41/09* (2006.01)
*B81B 7/04* (2006.01)
(Continued)

(52) U.S. Cl.
CPC ......... *H01H 1/0036* (2013.01); *B81B 7/0064* (2013.01); *B81C 1/00698* (2013.01);
(Continued)

(58) Field of Classification Search
CPC .............. H01H 1/0036; B81B 2201/01; H01L 41/0933
See application file for complete search history.

(56) References Cited

U.S. PATENT DOCUMENTS 4,030,943 A    6/1977  Lee et al. ........................ 148/1.5
4,672,849 A *  6/1987  Hoshino .................. G01H 11/06
                                                    257/E27.006
(Continued)

FOREIGN PATENT DOCUMENTS

CN          2658933 Y        11/2004
EP          0 255 911 A2      2/1988  ............ H01L 23/52
WO      WO 2009/147600 A1    12/2009  ............ H01H 59/00

OTHER PUBLICATIONS

Maciel et al., "High-Reliability MEMS Switches for Wireless Applications," presented at 2010 iMAPS New England—37th Symposium & Expo—Boxborough, MA, 26 pages, May 4, 2010.
(Continued)

*Primary Examiner* — Benjamin Sandvik
*Assistant Examiner* — Leslie Pilar Cruz
(74) *Attorney, Agent, or Firm* — Sunstein Kann Murphy & Timbers LLP

(57) ABSTRACT

A MEMS apparatus has a substrate, an input node, an output node, and a MEMS switch between the input node and the output node. The switch selectively connects the input node and the output node, which are electrically isolated when the switch is open. The apparatus also has an input doped region in the substrate and an output doped region in the substrate. The input doped region and output doped region are electrically isolated through the substrate—i.e., the resistance between them inhibits non-negligible current flows between the two doped regions. The input doped region forms an input capacitance with the input node, while the output doped region forms an output capacitance with the output node.

20 Claims, 6 Drawing Sheets

(51) Int. Cl.
*H01H 1/00* (2006.01)
*B81B 7/00* (2006.01)
*B81C 1/00* (2006.01)
*H01H 59/00* (2006.01)
*H01P 1/12* (2006.01)

(52) U.S. Cl.
CPC ......... *H01H 59/0009* (2013.01); *H01P 1/127* (2013.01); *B81B 2201/014* (2013.01); *B81B 2207/03* (2013.01); *B81B 2207/07* (2013.01); *B81B 2207/115* (2013.01); *B81C 2201/0171* (2013.01); *B81C 2203/075* (2013.01)

(56) References Cited

U.S. PATENT DOCUMENTS

| | | | |
|---|---|---|---|
| 6,046,659 A | 4/2000 | Loo et al. | 333/262 |
| 6,115,231 A | 9/2000 | Shirakawa | 361/233 |
| 6,153,839 A | 11/2000 | Zavracky et al. | 200/181 |
| 6,377,438 B1 * | 4/2002 | Deane et al. | 361/278 |
| 6,384,353 B1 | 5/2002 | Huang et al. | 200/181 |
| 6,853,072 B2 | 2/2005 | Asano et al. | 257/728 |
| 7,943,411 B2 | 5/2011 | Martin et al. | 438/50 |
| 2008/0093685 A1 * | 4/2008 | Watanabe | B81B 3/0086 257/415 |
| 2010/0320606 A1 | 12/2010 | Jain et al. | 257/751 |
| 2011/0147861 A1 | 6/2011 | Steeneken et al. | 257/415 |
| 2013/0140155 A1 | 6/2013 | Urvas et al. | 200/181 |

OTHER PUBLICATIONS

Chinese Patent Office Action — Chinese Application for Invention No. 20150083334.4, dated Feb. 16, 2017, 9 pages. (in Chinese).

* cited by examiner

MEMS DEVICE WITH CONSTANT CAPACITANCE

FIELD OF THE INVENTION

The invention generally relates to MEMS devices and, more particularly, the invention relates to reducing loss and harmonics due to parasitics in MEMS devices.

BACKGROUND OF THE INVENTION

MEMS switches often have an input node, an output node, and a movable member that selectively connects the input node with the output node. Both nodes and the movable member often are formed on a substrate. The switch may have an electrode that, during use, applies an electrostatic force to urge a cantilever downward toward a contact on the output node. When connected, the input node, moveable member, and output node form an electrical channel for directing signals from the input node to the output node. To break this channel, the electrode applies an opposite force, or no force at all, urging the movable member away from the output node.

Undesirably, a sufficiently high radio frequency power (i.e., RF Power) applied to the input node can create a non-linear parasitic capacitance between the input node and the substrate—it creates harmonics. In other words, this parasitic capacitance varies as a function of input voltage. Undesirably, this unpredictable input parasitic capacitance creates harmonics that can adversely affect performance.

SUMMARY OF VARIOUS EMBODIMENTS

In accordance with one embodiment of the invention, a MEMS apparatus has a substrate, an input node, an output node, and a MEMS switch between the input node and the output node. The switch selectively connects the input node and the output node, which are electrically isolated when the switch is open. The apparatus also has an input doped region in the substrate and an output doped region in the substrate. The input doped region and output doped region are electrically isolated through the substrate—i.e., the resistance between them inhibits non-negligible current flows between the two doped regions. The input doped region forms an input capacitance with the input node, while the output doped region forms an output capacitance with the output node.

The input doped region may be considered to have an outer periphery in the substrate. In that case, the substrate may be considered to form a border region about the outer periphery, and the border region has a higher resistance than the input doped region. In illustrative embodiments, least a portion of the input doped region is vertically aligned with the input node (i.e., there is overlap in the vertical direction). In a similar manner, at least a portion of the output doped region may be vertically aligned with the output node.

Various implementations may use a plurality of switches. To that end, the apparatus may have a plurality of output nodes, and a plurality of MEMS switches configured to selectively electrically connect the input node with no more than one of the plurality of output nodes at a given time. The apparatus also may have a plurality of output doped regions in the substrate forming a plurality of output capacitances with the plurality of output nodes. Each output doped region is electrically isolated from the input doped region through the substrate. The plurality of output doped regions each may be vertically aligned with one of the plurality of output nodes.

Among other things, the input node may include an input pad configured to receive a signal and a conductive path extending from the pad. Moreover, the apparatus may have an insulation layer between the switch and the substrate, where the insulation layer is positioned between the input doped region and the input node. The insulation layer also may be between the output doped region and the output. Alternatively or in addition, the input doped region may be bounded by the top surface of the substrate.

The apparatus also may have an external resistor coupled with the input node, and a cap secured to the substrate to cover forming a chamber. In that case, the MEMS switch is protected within the chamber. The apparatus further has a conductive plate between the substrate and the cap. The conductive plate forms a parasitic capacitance with the input node, which in turn has an input impedance that is a function of the parasitic capacitance. The input impedance preferably is within several percent (for example, within ten percent) of the resistance of the external resistor, although it may exceed that tolerance as permitted by the application. In preferred embodiments, the input capacitance is a constant parasitic capacitance.

In accordance with another embodiment, a MEMS apparatus has a substrate with a top surface, an insulator on the substrate top surface, an input node, an output node, and a MEMS switch formed on the insulation layer. The MEMS switch is between the input node and the output node, and the switch selectively electrically connects the input node and the output node. The input node and output node are electrically isolated when the switch is open. The apparatus also has an input parasitic capacitor formed between the input node and the substrate, and an output parasitic capacitor formed between the output node and the substrate. The input capacitor is electrically isolated from the output capacitor through the substrate.

In accordance with other embodiments, a method of forming a MEMS switch provides an insulation layer on a substrate, where the insulation layer and substrate meet at an interface. The method also dopes a first portion of the substrate at the interface to form a first doped portion, and dopes a second portion of the substrate at the interface to form a second doped portion. The first and second doped portions are electrically unconnected through the substrate. The method also forms an input node, and output node, and a movable member between the input and output nodes. The input node, output node and movable member form a switch that selectively electrically connects the input node and the output node. The input node is vertically aligned with the first doped portion, and the output node is vertically aligned with the second doped portion.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a MEMS switch is configured to control its input impedance, consequently improving its overall insertion loss performance. Accordingly, more of the input signal should transmit from the input to the output of the switch. To that end, illustrative embodiments form multiple unconnected doped regions at prescribed regions within the MEMS substrate. As a result, these doped regions substantially mitigate undesirable harmonics produced by parasitic capacitances between MEMS nodes and the substrate. Details of illustrative embodiments are discussed below.

Figure 1:
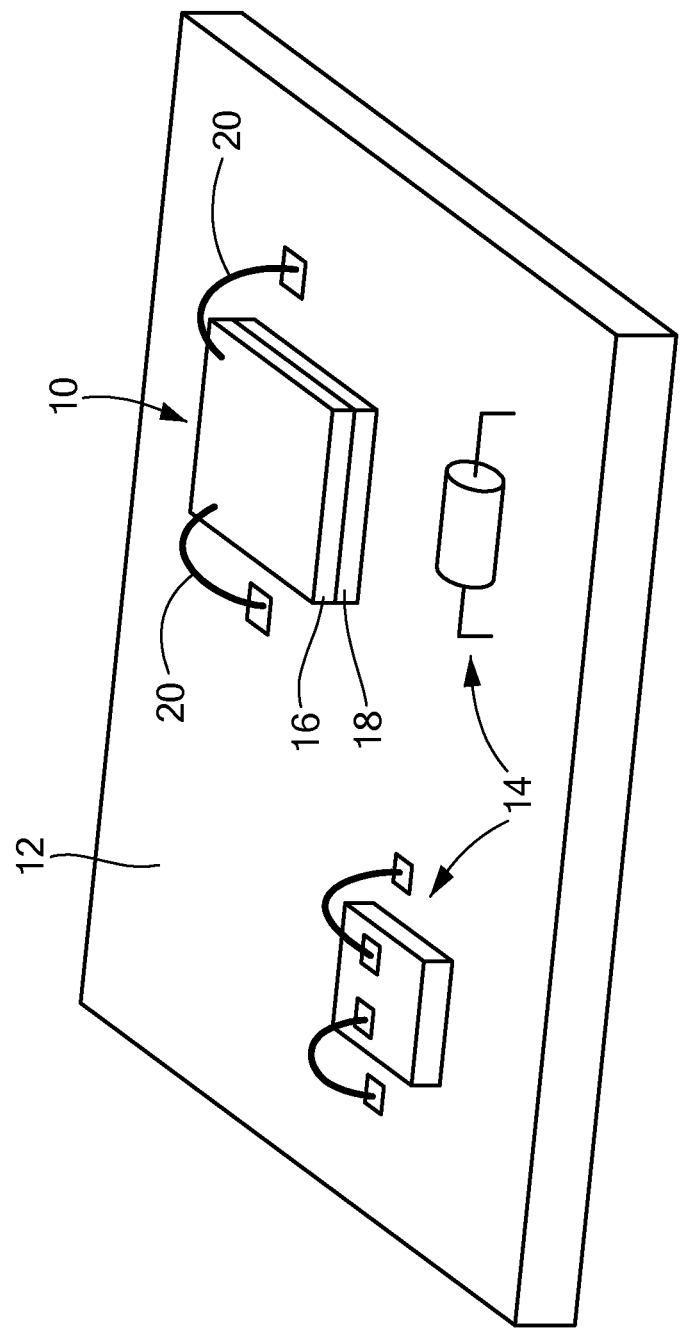
FIG. 1 schematically shows a system that may use a switch configured in accordance with illustrative embodiments of the invention.

FIG. 1 schematically shows a system that may use a MEMS switch 10 configured in accordance with illustrative embodiments of the invention. The system includes a printed circuit board 12 supporting and electrically connecting a plurality of circuit elements 14, including the MEMS switch 10. Among other things, the circuit elements 14 may include transistors, diodes, integrated circuits, such as the noted switch 10, application specific integrated circuits, microprocessors, etc., discrete circuits, such as resistors, capacitors, and inductors, and other elements known in the art. The system may be part of a larger system, such as a personal computer, guidance system, automobile air bags safety system, or any other system using a MEMS switch 10.

As known by those skilled in the art, the MEMS switch 10 has a package for protecting its fragile microstructure from its environment. For example, some embodiments may use a higher level package, such as a substrate package with a lid. Other embodiments, such as the embodiments shown in FIG. 1, may use a wafer level package. To that end, the switch 10 has a cap 16 secured to its substrate 18, thus producing a chamber (not shown in FIG. 1, but shown in subsequent figures) protecting fragile MEMS microstructure. Wire bonds 20 connect the switch 10 to pads on the printed circuit board 12, thus providing electrical access to the components within the interior chamber. Other embodiments may use surface mount technology or pin arrays to electrical and physically connect the switch 10 with the printed circuit board 12.

Figure 2:
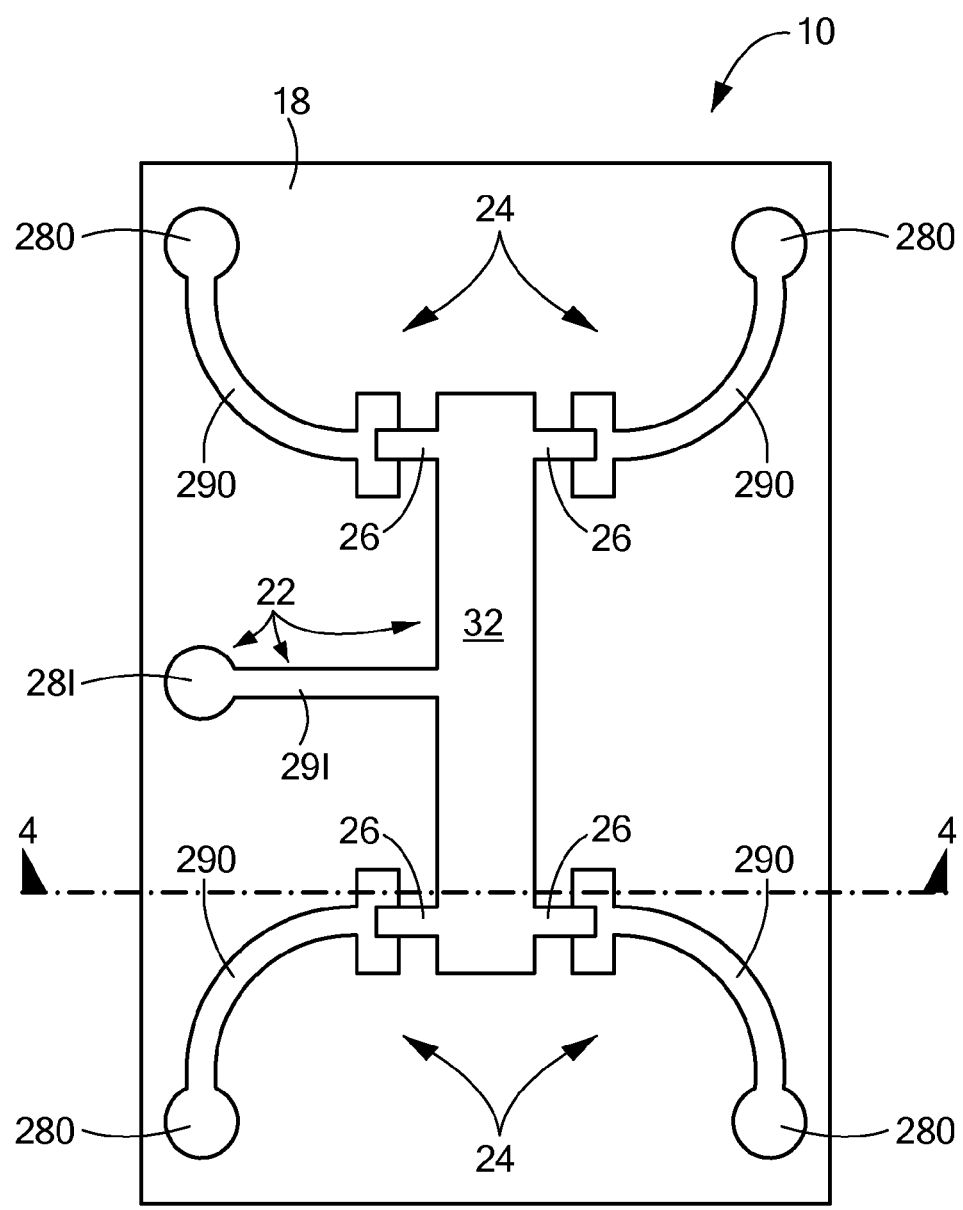
FIG. 2 schematically shows a top view of a switch die configured in accordance with illustrative embodiments of the invention.

FIG. 2 schematically shows a top view of the MEMS switch 10 shown in FIG. 1 with its cap 16 removed. It should be noted that for simplicity, this view only shows the relevant features of the switch 10, consequently omitting many other features. As shown, the switch 10 includes an input node 22 for receiving an input signal, and four output nodes 24 that alternatively and selectively connect with the input node 22. To that end, the input node 22 may be considered to have four respective movable members 26 that are controlled to selectively contact the output nodes 24. In illustrative embodiments, no more than one output node 24 can electrically connect with the input node 22. For example, the input node 22 may connect with only the output node 24 in the lower right corner of the drawing. In that case, the other three output nodes 24 are electrically isolated from the input node 22. In other embodiments, the input node 22 can connect with more than one output node 24 at the same time. Moreover, the input node 22 and/or output node 24 can include a ground.

The implementation shown in FIG. 2 forms the input node 22 as having a relatively large surface area pad 28I for receiving an electrical signal via a wire bond 20 or other similar component, and a trace or transmission line 29I extending from the pad 28I to a larger conductor 32 that forms the movable members 26. In a similar manner, the output nodes 24 each have a relatively large surface area pad 28O for transmitting an electrical signal via the wire bond 20 or other similar component, and a trace or transmission line 29O extending to its contact pad 28O. The movable member 26 selectively contacts the contact pad 28O to electrically connect the input node 22 with one of the output nodes 24.

It should be noted that the specific layout and design shown in FIG. 2 is but one of many potential implementations. For example, the switch 10 may have as few as one output node 24, two output nodes 24, three output nodes 24, five output nodes 24 or more. As another example, the pads 28I and 28O and transmission lines 29I and 29O may have different shapes and configurations. Accordingly, discussion of four output nodes 24, their shapes, and other specific features may be changed and still remain within the spirit of illustrative embodiments.

Figure 3A:
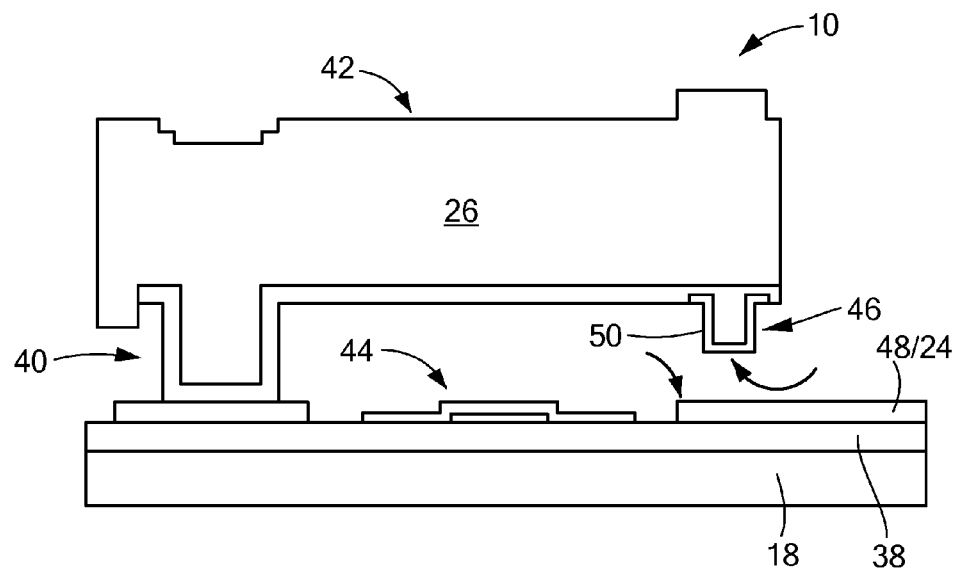
FIG. 3A schematically shows a switch that may be used in accordance with illustrative embodiments of the invention. This figure shows the switch in the open position.
Figure 3B:
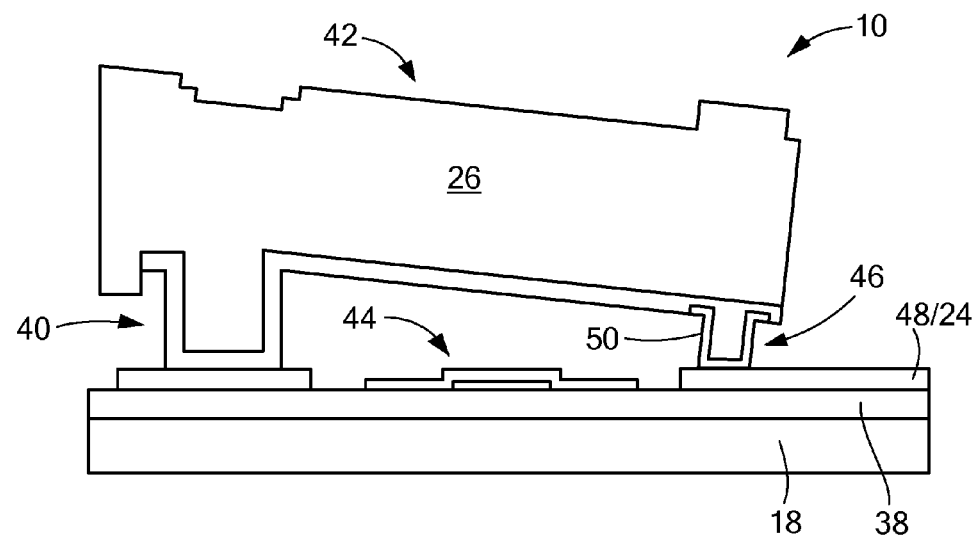
FIG. 3B schematically shows the switch of FIG. 3A in the closed position.

FIGS. 3A and 3B show additional details of a movable member 26 that may implement those shown in FIG. 2. Specifically, as known by those skilled in the art and noted above, when in contact with its output node 24, the movable member 26 electrically connects the input node 22 with the output node 24. Accordingly, when in this state for one of the four output nodes 24, the switch 10 may transmit electronic signals between the input node 22 and the selected output node 24. Conversely, when the switch 10 is open, the input node 22 and output node 24 are not electrically connected and thus, cannot electrically communicate through this path.

FIG. 3A schematically shows a cross-sectional view of one of the movable portions of the MEMS switch 10 configured in accordance with illustrative embodiments of the invention. Specifically, the switch 10 has the prior noted substrate 18 with an insulation layer 38 supporting and suspending a movable structure, which alternatively opens and closes a circuit. To that end, the movable structure includes the noted movable member 26 movably connected to a stationary member 40. The movable member 26, which is cantilevered in this embodiment, effectively forms a flexible spring 42 that permits it to move in the prescribed manner.

The stationary member 40 illustratively is fixedly secured to the substrate 18 and, in some embodiments, serves as an actuation electrode to move the movable member 26, when necessary. Alternatively, or in addition, the switch 10 may have one or more other actuation electrodes, such as that shown and identified by reference number 44. It should be noted, however, that electrostatically actuated switches are but one embodiment. Various embodiments apply to switches using other actuation means, such as thermal actuators and electromagnetic actuators. Discussion of electrostatic actuation therefore is not intended to limit all embodiments.

The movable member 26 has an electrical contact 46 at its free end (i.e., at the output node 24) for alternately connecting with a corresponding contact point 48 on the output node 24. When actuated, the movable member 26 bends in a direction generally downward direction, relative to the substrate 18, to contact the contact point 48 on the substrate 18 (see FIG. 3B). Accordingly, during use, the movable member 26 alternatively opens and closes its electrical connection with the output node 24.

In high-frequency applications, it is desirable to have contacts that can withstand repeated contact. Accordingly, some embodiments apply a hard, conductive layer 50 to the exposed surface of the movable member 26 and/or contact surface 46. For example, one or both of the two noted contact surfaces 46 and/or 48 can be formed from a platinum-series based material (also known as "platinum group" or "platinum metals"). Specifically, as known by those skilled in the art, platinum-series elements include platinum (Pt), ruthenium (Ru), rhodium (Rh), palladium (Pd), osmium (Os), and iridium (Ir). Contact surfaces 46 or 48 having platinum-series based materials therefore may comprise at least a platinum-series based element. For example, ruthenium dioxide ($RuO_2$, or RuO2) is considered to be a platinum-series based material because part of it is ruthenium.

Rather than use only one movable member 26 per output node 24, illustrative embodiments may use an array of parallel movable members 26 at each output node 24. Accordingly, the output node 24 has a corresponding number of contacts, or at least a corresponding surface area for receiving those members 26. Moreover, it should be noted that the cantilever design was shown for simplicity purposes only. Accordingly, illustrative embodiments may incorporate other MEMS switch designs known in the art, such as a plunger types, or movable members 26 that move laterally (i.e., parallel to the substrate 18) to contact corresponding contacts that are laterally spaced from it.

As noted above, the die forming the electronic switch 10 can have many other components. For example, the die could also have circuitry (not shown) that controls a number of functions, such as actuation of the movable member 26. Accordingly, discussion of the switch 10 without circuitry is for convenience only.

Figure 4:
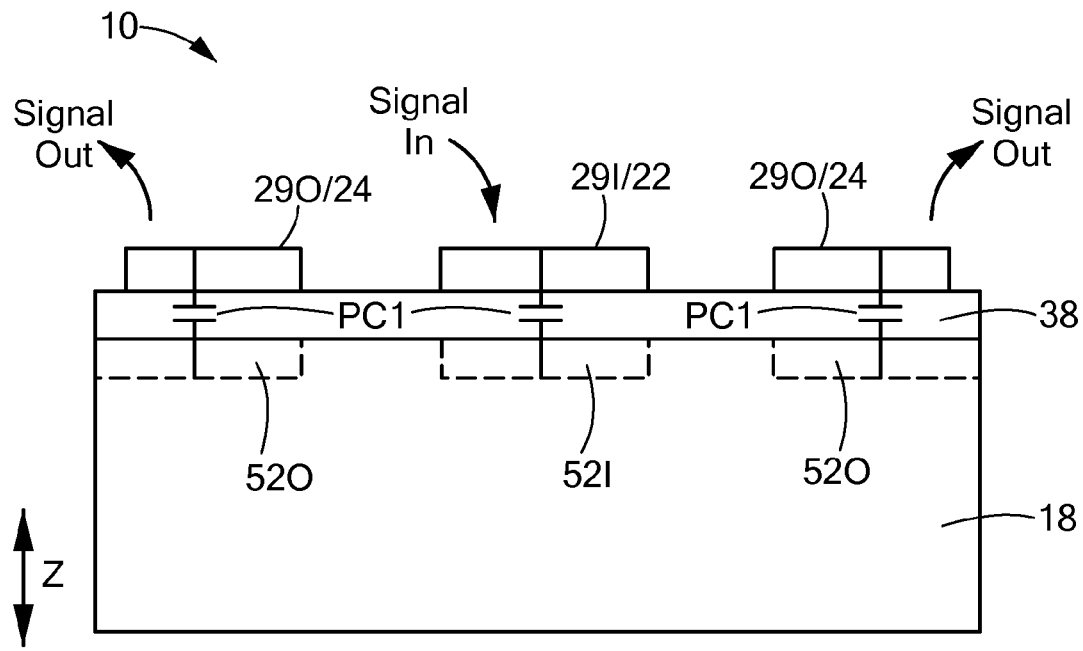
FIG. 4 schematically shows a cross-sectional view of the switch of FIG. 2 across line 4-4 of FIG. 2.

FIG. 4 schematically shows a cross-sectional view of the switch 10 shown in FIG. 2 across line 4-4 (with the cap 16 removed). This view more clearly shows the substrate 18 and the insulation layer 38 across the top surface of the substrate 18. This cross-sectional view also shows to output nodes 24 near the edges of the substrate 18, and the input node 22 between the output nodes 24. This cross-sectional view does not show the movable members 26.

The various components of the switch 10 may be formed from any of a wide variety of materials. For example, among other things, the substrate 18 may be formed from single crystal silicon, while the insulator may be formed from an oxide. The input and output nodes 24 preferably are made from the same material using conventional micromachining technology. Among other things, the input and output nodes 24 may be formed from a metal, such as gold, a doped semiconductor, such as polysilicon, or a doped and etched single crystal silicon wafer. For example, the switch 10 may be formed from a silicon on insulator wafer (known as a "SOI wafer"), which is micromachined to form the appropriate structure.

As known by those skilled in the art, the input and output nodes 22 and 24, as well as other conductors in the layer(s) forming the MEMS microstructure, form a parasitic capacitance across the insulation layer to the substrate 18. FIG. 4 schematically shows this parasitic capacitance PC1. Specifically, using the input node 22 as an example, the bottom surface of the input node 22 (i.e., the interface of the input node 22 and the insulation layer 38) effectively forms the first plate of the capacitor PC1, while some plane within the substrate 18 effectively forms the second plate of the capacitor PC1. This plate may be referred to as an input capacitor, although it is not necessarily an intended capacitor of the device. Undesirably, for prior are devices, the location of this plane (within the substrate 18) used as the second plate fluctuates as a function of the input voltage applied to the input node 22.

In particular, as known by those in the art, the substrate 18 has a high resistivity and thus, relatively few free mobile charges for collecting on the effective second plate of the capacitor PC1. Application of a voltage to the input node 22 thus draws the relatively few free mobile charges in the substrate 18 to that second plate, forming a relatively large depletion region within the substrate 18. The bottom of that depletion region (from the perspective of the drawings) forms the second plate at the noted plane within the substrate 18.

Accordingly, a small voltage applied to the input node 22 requires only a small amount of free mobile charges for the second plate, thus causing that in-substrate plane/plate to be relatively close to the interface of the insulator and the substrate top surface. Application a relatively high-voltage to the input node 22, however, requires more free mobile charges, causing a much larger depletion region. Since capacitance is a function of the distance between the two capacitive plates, the capacitance PC1 necessarily varies as a function of the input voltage. As noted above, this undesirably causes harmonics, which can adversely impact signal transmission through the switch 10.

Illustrative embodiments substantially avoid that problem. Specifically, to substantially mitigate harmonics, the switch 10 has a plurality of doped regions 52I and 52O with a relatively high concentration of free mobile charges. FIG. 4 schematically shows three such regions vertically spaced (i.e., in the Z-direction) from corresponding structure/nodes transmitting signals—an input doped region 52I vertically spaced from the input node 22, a first output doped region 52O vertically spaced from a corresponding first output node 24, and a second output doped region 52O vertically spaced from a corresponding second output node 24. By being vertically spaced from the input nodes 22, the input doped region 52I has at least an effective upwardly facing portion in the Z direction that at least overlaps with (i.e., faces) the downwardly facing footprint of the input node 22. Of course, the output nodes 24 preferably have a corresponding relationship with their output doped regions 52O.

Each doped region 52I and 52O preferably is electrically isolated from the other doped regions 52I and 52O through/within the substrate 18. Stated another way, the doped regions 52I and 52O each are considered to form isolated, highly conductive regions that are bounded by highly resistive regions formed by the substrate 18 alone, an insulative trench, or some other structure. Some embodiments thus may be considered to have an outer (lateral) periphery surrounded by a border region formed by the substrate 18 or other material in the substrate 18. The border region has a higher resistance than the doped region 52I or 52O. Accordingly, the doped regions 52I and 52O preferably cannot transmit any more than a negligible signal or current (e.g., less than one percent of the signal across the switch 10) to each other through the substrate 18.

In other words, each doped region 52I and 52O is doped to have a carrier concentration that is higher than the region of the substrate 18 completely surrounding it. The substrate 18 preferably is lightly doped, having a carrier concentration that is greater than its intrinsic carrier concentration (1.4×$10^{14}$ per cubic centimeter for silicon). For example, the substrate 18 could have a carrier concentration of about 1.4×$10^{15}$, or 1.4×$10^{16}$, while the doped regions 52I and 52O could have a significantly higher concentration, such as 1.4×$10^{17}$ or 1.4×$10^{18}$ or 1.4×$10^{19}$. The light doping of substrate 18 thus is considered to electrically isolate the (highly) doped region 52I from the (highly) doped region 52O. As such, no more than a negligible signal can pass between the two doped regions 52I and 52O.

As isolated portions of the substrate 18, each doped region 52I or 52O may be considered to have a lateral shape forming a surface that generally faces the bottom surface its corresponding conductor/transmission line (e.g., transmission lines 29O or 29I, among others). For example, the input doped region 52I may be considered to have a lateral shape that generally faces the bottom surface of the input node 22. In illustrative embodiments, rather than simply overlapping, the lateral shapes and areas of the input node 22 and the input doped region 52I are substantially the same. In some other embodiments, the shapes of the corresponding regions may be different, but the area of the face of one of the two shapes is larger than the other. For example, the shape of the input doped region 52I may be different than that of the input node 22, but have a larger upwardly facing area than the downward facing area of the input node 22. Other embodiments have doped region and MEMS node shapes that are the same, but with different areas.

Application of a relatively high-voltage to one of the nodes therefore should not produce a parasitic capacitance that is appreciably different than that produced by a relatively low voltage. This maintains a substantially constant capacitance, thus substantially mitigating undesired harmonics. It should be noted that although FIG. 4 only shows three doped regions 52I and 52O, illustrative embodiments form doped regions 52O under some or all of the output nodes 24. These are portions of the integrated circuit chip that are alternatively electrically connected to the input node 22 through the microstructure via the movable structure. More generally, various embodiments form isolated, spaced apart doped regions under some or all of the signal conductors within the switch 10.

Figure 5:
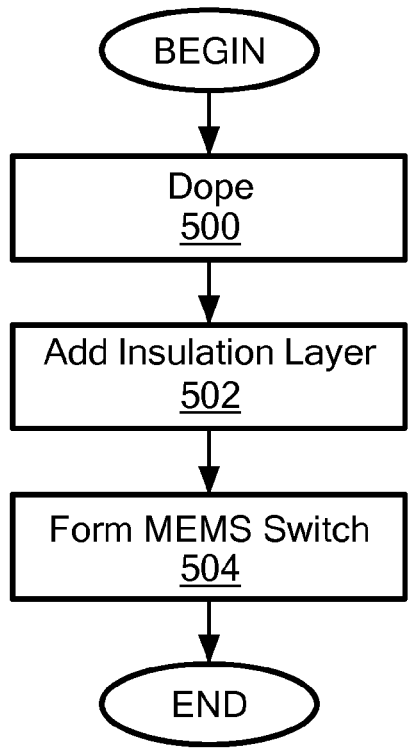
FIG. 5 shows a process of forming a switch in accordance with illustrative embodiments of the invention.

Those skilled in the art can fabricate the switch 10 described above using a number of conventional micromachining processes. FIG. 5 schematically shows a process of fabricating the MEMS switch 10 in accordance with illustrative embodiments of the invention. It should be noted that this process is a simplified version of a process that has many more steps. In addition, some of the steps of the process can be performed in a different order than that disclosed, and some sequential steps can be performed at substantially the same time. Accordingly, this process is but one of many different illustrative processes that may implement various embodiments the invention. It also should be noted that the process practices bulk fabrication processing using a MEMS wafer with a two-dimensional array of MEMS chips. Those skilled in the art nevertheless can use this process to form one MEMS device/switch 10 at a time.

The process begins at step 500, which uses some conventional technique, such as ion implantation techniques or diffusion (among other ways), to dope prescribed portions of the substrate 18 with an appropriate dopant, such as boron or phosphorus. To that end, conventional techniques apply dopant to prespecified regions of the top surface of the substrate 18. These prespecified regions are formed with appropriate lateral shapes and concentrations, and extend from the top surface of the substrate 18. The dopant preferably does not penetrate deeply beyond the top surface of the substrate 18. For example, the substrate 18 may have a thickness in the Z-direction of approximately 400 microns, while the dopant may penetrate no more than fractions of a single micron into the top surface of the substrate 18. This very thin layer of dopant at unconnected locations should have no more than a negligible impact on the resistivity of the substrate 18. In illustrative embodiments, the substrate 18 is lightly doped before this step—having a carrier concentration that is greater than its intrinsic carrier concentration, but less than the carrier concentrations formed by this doping step.

After doping the surface to form the doped regions 52I and 52O, the process adds the insulation layer 38 to the top layer of the substrate 18 (step 502). Accordingly, this step covers the doped regions 52I and 52O. Next, step 504 uses conventional micromachining processes to form the microstructure to have the configuration described above.

Figure 6:
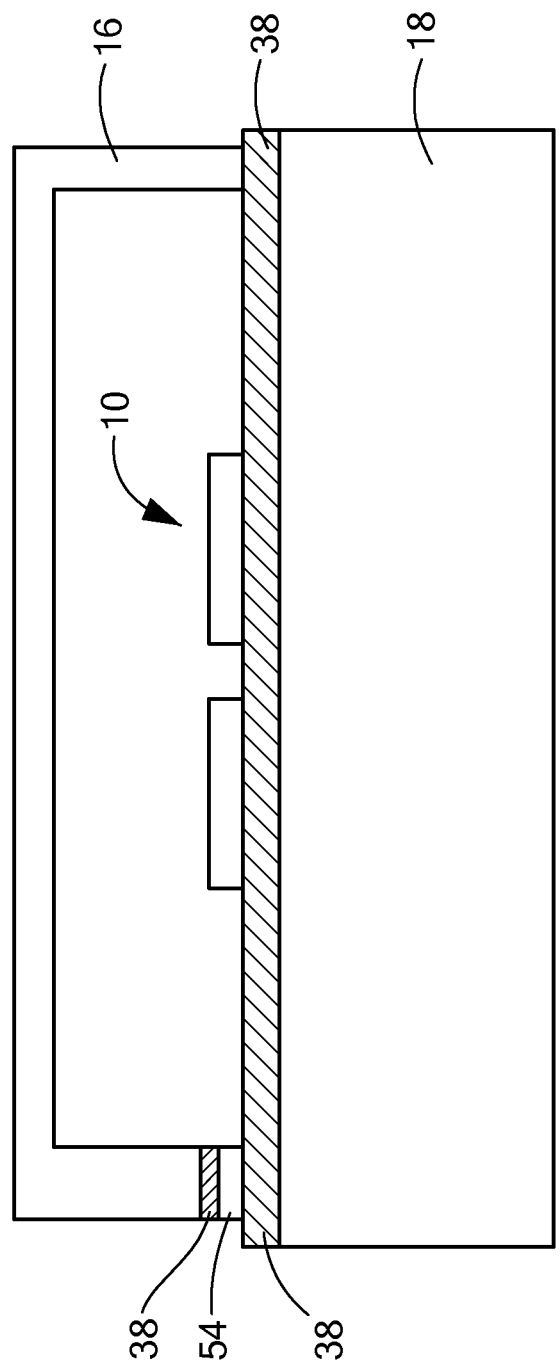
FIG. 6 schematically shows a cross-sectional view of an alternative embodiments of the invention.

As noted above, some embodiments use a cap 16 to protect the fragile MEMS microstructure. FIG. 6 schematically shows a cross-sectional view of the switch 10, showing the substrate 18, insulation layer 38, and cap 16. Some prior art designs directly secure the cap 16 to the insulation layer 38. Undesirably, many such designs consequently produce additional parasitic capacitance is that can further degrade the signals across the switch 10. Alternative embodiments, however, substantially mitigate this signal degradation by forming a new capacitor between a portion of the cap 16 and a portion of the substrate 18. Specifically, FIG. 6 schematically shows a given plate 54 of this capacitor between two insulation layers (both identified by reference number 38 for simplicity)—one insulation layer 38 is the same one that covers the substrate 18, while the other insulation layer 38 secures the cap 16 to the given plate 54.

Figure 7:
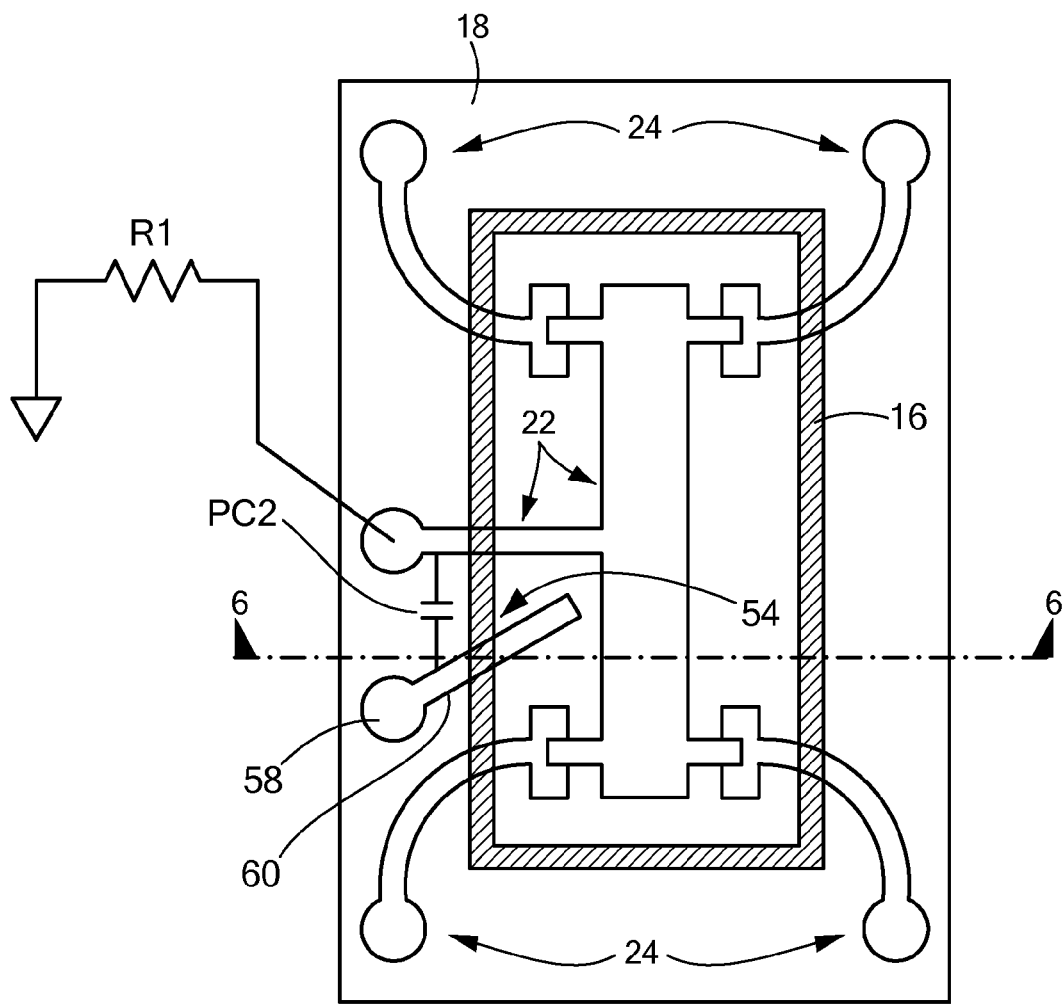
FIG. 7 schematically shows a plan view of the alternative embodiment of FIG. 6.

FIG. 7 shows this plate 54 and its relation to the switch 10 in a plan view, showing the outline of where it contacts the substrate 18 and its microstructure. Specifically, FIG. 7 schematically shows a new pad 58 and a new trace/transmission line 60 that, together with the plate 54, form a single node. The portion of this transmission line 60 between the wall of the cap 16 and the substrate 18 forms the given plate 54 of this new capacitor. The other plate of this new capacitor is the small bottom facing portion of the cap 16—the cap 16 portion contacting the insulator 38 just above the given plate 54. The new pad 58 preferably is grounded, which effectively shunts to ground much of the parasitic signal produced by the parasitic capacitances formed by the cap 16.

The entire node also forms a lateral parasitic capacitance with the input line 29I. This parasitic capacitance is represented in FIG. 7 as capacitor PC2. The return loss of the switch 10 (i.e., the amount of input signal reflected back by the input) can be mitigated by using an input resistor Rin that is about equal to the input impedance of the switch 10. Accordingly, these alternative embodiments select the physical characteristics of this new node (i.e., the new pad 58 and new transmission line 60) to produce a parasitic capacitor PC2 that is about equal to the input resistor Rin, within permitted design tolerances. For example, the input resistor Rin may have a resistance that is within five percent of the input impedance of the switch 10. Other embodiments may have wider tolerances (e.g., up to ten percent) or tighter tolerances (e.g., up to two percent). Accordingly, use of this additional new node provides the dual benefit of reducing/mitigating return loss and drawing away parasitic signals toward ground, effectively improving the output signal to noise ratio.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS apparatus comprising:
a substrate;
an input node;
an output node;
a MEMS switch between the input node and the output node, the switch selectively connecting the input node and the output node, the input node and output node being electrically isolated when the switch is open; and
an input doped region in the substrate, an output doped region in the substrate, the input doped region and output doped region being electrically isolated through the substrate,
the input doped region forming a substantially constant input capacitance with the input node independent of changing input voltage,
the output doped region forming a substantially constant output capacitance with the output node independent of changing output voltage.

2. MEMS apparatus as defined by claim 1 wherein the input doped region has an outer periphery in the substrate, the substrate forming a border region about the outer periphery, the border region having a higher resistance than the input doped region.

3. MEMS apparatus as defined by claim 1 wherein at least a portion of the input doped region is vertically aligned with the input node.

4. MEMS apparatus as defined by claim 1 wherein at least a portion of the output doped region is vertically aligned with the output node.

5. MEMS apparatus as defined by claim 1 further comprising:
a plurality of output nodes;
a plurality of MEMS switches configured to selectively electrically connect the input node with at least one of the plurality of output nodes at a given time; and
a plurality of output doped regions in the substrate forming a plurality of output capacitances with the plurality of output nodes, each output doped region being electrically isolated from the input doped region through the substrate.

6. MEMS apparatus as defined by claim 5 wherein the plurality of output doped regions each are vertically aligned with one of the plurality of output nodes.

7. MEMS apparatus as defined by claim 1 wherein the input node comprises an input pad configured to receive a signal and a conductive path extending from the pad.

8. MEMS apparatus as defined by claim 1 further comprising an insulation layer between the switch and the substrate, the insulation layer being between the input doped region and the input node, the insulation layer being between the output doped region and the output node.

9. MEMS apparatus as defined by claim 1 wherein the substrate has a top surface, the input doped region bounded by the top surface of the substrate.

10. MEMS apparatus as defined by claim 1 further comprising:
an external resistor coupled with the input node;
a cap secured to the substrate forming a chamber, the MEMS switch being within the chamber; and
a conductive plate between the substrate and the cap, the conductive plate forming a parasitic capacitance with the input node, the input node having an input impedance that is a function of the parasitic capacitance, the input impedance being within ten percent of the resistance of the external resistor.

11. MEMS apparatus as defined by claim 1 wherein the input capacitance is a constant parasitic capacitance.

12. A MEMS apparatus comprising:
a substrate having a top surface;
an insulation layer on the substrate top surface;
an input node, an output node, and a MEMS switch formed on the insulation layer, the MEMS switch being between the input node and the output node, the switch selectively electrically connecting the input node and the output node, the input node and output node being electrically isolated when the switch is open; and
an input parasitic capacitor formed between the input node and the substrate,
an output parasitic capacitor formed between the output node and the substrate,
the input capacitor being electrically isolated from the output capacitor through the substrate.

13. MEMS apparatus as defined by claim 12 wherein the substrate includes an input doped region forming the input parasitic capacitance between the input node and the substrate.

14. MEMS apparatus as defined by claim 13 wherein the substrate includes an output doped region forming the output parasitic capacitance between the output node and the substrate.

15. MEMS apparatus as defined by claim 13 wherein the input doped region is vertically aligned with the input node.

16. MEMS apparatus as defined by claim 15 wherein the input node comprises an input pad configured to receive a signal and a conductive path extending from the pad, the input doped region has substantially the same lateral shape as the conductive path.

17. An apparatus comprising:
a substrate;
receiving means for receiving an input signal;
transmitting means for transmitting an output signal;
means for switching between the receiving means and transmitting means, the switching means selectively connecting the receiving means and the transmitting means, the receiving means and transmitting means being electrically isolated when the switching means is open; and
an input doped region in the substrate, an output doped region in the substrate, the input doped region and output doped region being electrically isolated through the substrate, the input doped region forming an input capacitance with the receiving means, the output doped region forming an output capacitance with the transmitting means.

18. The apparatus as defined by claim 17 wherein the input doped region has an outer periphery in the substrate, the substrate forming a border region about the outer periphery, the border region having a higher resistance than the input doped region.

19. The apparatus as defined by claim 17 wherein at least a portion of the input doped region is vertically aligned with the input node.

20. The apparatus as defined by claim 17 wherein at least a portion of the output doped region is vertically aligned with the output node.

* * * * *